(12) United States Patent
Vester et al.

(10) Patent No.: US 11,137,465 B2
(45) Date of Patent: Oct. 5, 2021

(54) METHOD AND SYSTEM FOR CLEANING A MAGNETIC RESONANCE MEASUREMENT DATASET, COMPUTER PROGRAM AND COMPUTER-READABLE STORAGE MEDIUM

(71) Applicant: Siemens Healthcare GmbH, Erlangen (DE)

(72) Inventors: Markus Vester, Nuremberg (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/582,444

(22) Filed: Sep. 25, 2019

(65) Prior Publication Data

US 2020/0096588 A1 Mar. 26, 2020

(30) Foreign Application Priority Data

Sep. 25, 2018 (DE) .......................... 102018216362.6

(51) Int. Cl.
*G01V 3/00* (2006.01)
*G01R 33/561* (2006.01)
*G01R 33/56* (2006.01)
*G01R 33/58* (2006.01)

(52) U.S. Cl.
CPC ...... *G01R 33/5611* (2013.01); *G01R 33/5608* (2013.01); *G01R 33/58* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 2007/0219740 A1 | 9/2007 | Wilson | |
| 2010/0253339 A1* | 10/2010 | Gross | G01R 33/565 324/309 |
| 2011/0093233 A1* | 4/2011 | Griswold | G01R 33/4824 702/106 |
| 2013/0274592 A1* | 10/2013 | Shin | G01R 33/4826 600/420 |
| 2017/0261582 A1* | 9/2017 | Blasche | G01R 33/583 |
| 2018/0224513 A1 | 8/2018 | Zeller | |

FOREIGN PATENT DOCUMENTS

DE 102017201883 A1 8/2018

* cited by examiner

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

Method and system for cleaning a magnetic resonance measurement dataset. In the method, a GRAPPA kernel is calibrated on the measurement dataset, k-space values of the measurement dataset are verified against a predefined intensity criterion in order to identify false values, the k-space values of the measurement dataset are reconstructed point-by-point using the calibrated GRAPPA kernel from respective others of the k-space values, and the false values are replaced with the corresponding reconstructed k-space values in order to generate a cleaned measurement dataset.

8 Claims, 3 Drawing Sheets

METHOD AND SYSTEM FOR CLEANING A MAGNETIC RESONANCE MEASUREMENT DATASET, COMPUTER PROGRAM AND COMPUTER-READABLE STORAGE MEDIUM

TECHNICAL FIELD

The disclosure relates to a method and a system for cleaning a magnetic resonance measurement dataset, in other words a measurement dataset recorded by means of a magnetic resonance system. The disclosure also relates to a corresponding computer program for carrying out the method and a computer-readable storage medium, on which such a computer program is stored.

BACKGROUND

In magnetic resonance imaging, many undesirable effects and artifacts are known and are observable depending on the situation or use case. These can be caused for example by flashovers, vibrating components, radio-frequency interferences on account of external radio-frequency sources, or scattering losses. Interferences of this kind can lead in particular to high-intensity contaminations in the k-space, in other words of k-space measurement values. These contaminations can in turn lead to undesirable effects such as a reduced signal-to-noise ratio, shadow-like effects or other image artifacts in magnetic resonance images ultimately generated from the measurement dataset, and thus to a degraded image quality.

Approaches adopted to date to counter these problems typically provide for adaptations at the hardware or device level. These can include for example additional filter devices, a more stable or oscillation-damped design of components or the like. To date, however, these measures have not demonstrated complete success in avoiding artifacts and can furthermore incur a high design, component and cost outlay.

SUMMARY

The object of the present disclosure is to enable an improved image quality of magnetic resonance images through data processing. This object is achieved according to the disclosure with the subject matter of the independent claims. Further advantageous embodiments and developments of the present disclosure are disclosed in the dependent claims, in the description and in the figures.

A method according to the disclosure serves, in other words is provided, to clean a magnetic resonance measurement dataset. The magnetic resonance measurement dataset is also referred to below for short as measurement dataset or original, in other words uncleaned, measurement dataset. In a first method step of the method, the measurement dataset is acquired from k-space values. Here, this acquisition can mean or comprise a recording, in other words measurement, of the k-space values or measurement values for the measurement dataset. Equally, however, the measurement dataset can already have been recorded, in other words generated, at an earlier time. The acquisition can then mean or comprise a retrieval of the measurement dataset out of or from a data carrier or electronic, in particular computer-readable, data store. The acquisition can also mean or comprise a receiving of the measurement dataset, in other words of the measured k-space values, via a corresponding data interface of a system configured up to carry out the method according to the disclosure or of a corresponding data processing device.

A further method step of the method according to the disclosure comprises a calibration of one or more GRAPPA kernels (GRAPPA: Generalized Autocalibrating Partial Parallel Acquisition) for the or on the measurement dataset, at least for or on a subregion or a subset of the measurement dataset, in other words of the k-space thereby mapped. k-space values, in other words measurement values or data points of the measurement dataset, which are used or are to be used for this calibration are determined by a predefined pattern. The k-space values to be used for the calibration are therefore selected automatically according to the predefined pattern. For example, the predefined pattern can therefore specify or determine, in other words define, a size of the GRAPPA kernels, a step size of a moving selection or calibration window and/or the like.

In a further method step of the method according to the disclosure, the k-space values of the measurement dataset are verified against a predefined intensity criterion in order to identify false values. Here, the verification against the intensity criterion can comprise in particular an automatic comparison, which is explained in more detail further below. False values in this context are k-space values, in other words measurement values of the measurement dataset, which have actually or probably been generated, modified or influenced by interferences and therefore do not specify or describe a real property of a respective measurement or examination object. In this context, the false values therefore are or represent contaminations of the measurement dataset. The false values can be peaks or intensity peaks, for example, which can lead or contribute to image-degrading interference effects or artifacts during a reconstruction or generation of a magnetic resonance data image (MR image) from the original measurement dataset.

In a further method step of the method according to the disclosure, a point-by-point reconstruction of k-space values of the measurement dataset by means of the calibrated GRAPPA kernels takes place by a respective linear combination of respective other k-space values, which are selected in each case according to a predefined schema. Here, this schema can differ in particular from the predefined pattern for the calibration of the GRAPPA kernels. In this reconstruction step, therefore, a k-space value is in each case synthesized, in other words calculated, at a specific position of the k-space or the measurement dataset. To this end, k-space values which differ from this respective k-space value are in each case used at different positions of the k-space or of the measurement dataset, in particular combined or offset with one another. These other, different k-space values can for example be k-space values surrounding the respective k-space value to be reconstructed or adjacent thereto. However, other k-space values of positions which are further away can also be used. This is determined, in other words defined, by the predefined schema. Depending on the embodiment of the method according to the disclosure, in this way all k-space values or positions of the measurement dataset or just a subset or partial set of the k-space values or positions of the measurement dataset can be reconstructed, in other words calculated, which is also explained in more detail further below. For the linear combinations, respective weighting factors can be predefined for the k-space values used. These weighting factors can for example specify or consider different distances of the respectively used k-space values from the k-space value to be reconstructed, in other words can be predefined or determined as a function of these different distances. It is thus advantageously possible to achieve a particularly accurate and reliable reconstruction of the k-space values.

In a further method step of the method according to the disclosure, the false values are replaced with the corresponding reconstructed k-space values to generate a cleaned measurement dataset. In other words, therefore, a k-space value reconstructed for a particular position in the k-space or in the measurement dataset is in each case written to this respective position. Here, depending on the embodiment of the method, a previously generated blank space or a measured k-space value can be overwritten. In both cases, however, an effective replacement is made for the respective position. Insofar as one or several false values have been found at all in the original measurement dataset, the cleaned measurement dataset therefore then contains measured k-space values from the original measurement dataset and one or more reconstructed k-space values.

The cleaned, in other words modified measurement dataset can then be processed further in order to generate an MR image or several MR images from the cleaned measurement dataset. Such an MR image generated from the cleaned measurement dataset then advantageously has fewer interference effects or artifacts, in other words a better image quality than an MR image generated directly from the original measurement dataset without the described cleaning.

In summary, therefore, the present disclosure provides for the use of parallel imaging methods in order to remove contaminations, in particular high-intensity artifacts, in the k-space.

The described method steps can also be applied or carried out in other sequences than those in which they have been described here. As a result, different embodiments of the disclosure can be produced, which are explained in more detail further below.

An alternative, simpler method can provide for the detection of specific peaks in the k-space and the replacement of corresponding k-space values with 0. Such a method can however have a series of disadvantages, which can advantageously be circumvented by the present disclosure. For example, an application of the alternative, simpler method is limited to cases in which only a limited number of peaks, in other words artifacts or contaminations, are detected and the artifacts are arranged distributed randomly, in other words not according to a regular pattern, in the k-space. Such regular patterns are typically generated by radio-frequency interferences (RF interferences). Corresponding artifacts cannot therefore be cleaned with the alternative, simpler method. Furthermore, with the alternative, simpler method, it is only possible to remove artifacts in a k-space periphery, in other words in edge regions of the k-space, where typically only relatively low k-space energies occur. If these conditions are not fulfilled, this can lead to a violation of the Nyquist criterion, which can lead to undersampling artifacts in a resulting MR image.

By contrast to this, the present disclosure offers the advantages that no violation of the Nyquist criterion occurs and thus undersampling artifacts can be avoided. Furthermore, the present disclosure can advantageously also be used to clean regular contamination patterns, which can be generated for example by RF interferences. Moreover, the present disclosure can advantageously also be used to clean artifacts or contaminations in the region of a center of the k-space, as a result of which it is advantageously possible to avoid shadowing effects and/or low-frequency signal variations. A further advantage of the present disclosure is that the method can be implemented relatively easily and integrated into existing reconstruction chains, which are used to generate MR images from magnetic resonance measurement data.

The present disclosure can be used to remove a large number of localized, in other words spatially limited, k-space artifacts or k-space contaminations, in particular also for further types of artifacts or contaminations which are not mentioned explicitly here.

It should be noted at this point that not only can the present disclosure be used to clean or replace individual k-space values or data points of the measurement dataset, but also that contiguous k-space regions, for example a respective false value and k-space values adjacent thereto, can be replaced, in other words cleaned, by means of the present disclosure.

In contrast to conventional parallel imaging GRAPPA methods, in which respectively all measurement points or k-space values on a k-space line, for example all $k_x$ positions on a specific $k_y$ line in the k-space, must be reconstructed, the present disclosure advantageously enables only individual k-space values, for example at an individual specific position $k_x$, $k_y$, in the k-space, to be interpolated, in other words reconstructed and thus cleaned. This advantageously makes it possible for the present disclosure to be used in most imaging scenarios, in particular without there being a risk of introducing or generating parallel imaging artifacts.

The present disclosure can advantageously be combined with a conventional parallel imaging, which uses for example SENSE, GRAPPA, CAIPIRINHA or SMS, and thus used in a relatively early section of a reconstruction pipeline, since the method according to the disclosure can advantageously also be applied to data with an undersampling in the $k_y$ direction or in the $k_z$ direction. No fully sampled k-space must therefore be reconstructed by means of the present method according to the disclosure. Rather, it can suffice to replace only individual false values, in other words contaminated k-space points or data points of the measurement dataset, and to restore an originally provided undersampling pattern of the k-space or to complete the same after removal of the false values.

Furthermore, the present disclosure can advantageously be combined with different detection methods for detecting the false values. For example, a detection of the false values on a digital signal processing level (DSP level) is possible in a relatively early stage of a sampling process, at least provided that associated k-space positions or k-space coordinates are stored for corresponding detections, in other words for detected false values, and are thus available for the present method according to the disclosure.

In an advantageous embodiment of the method according to the disclosure, an exceeding of a predefined threshold value is verified as the intensity criterion and, initially by removing the corresponding false values which fulfill this intensity criterion, a reduced measurement dataset is generated from the measurement dataset. The threshold value used here can be determined or predefined for example on the basis of empirical values for typical peak intensities and/or on the basis of a g-factor (geometry factor) of a respective acquisition of the measurement dataset. It is then determined which k-space regions in the reduced measurement dataset can be used or cannot be used for the calibration of the GRAPPA kernel or kernels under the condition that, when the predefined pattern is used, no blank spaces generated by the removal of the false values in the reduced measurement dataset are to flow into the calibration, in other words are to be used for the calibration.

The measurement dataset can for example take the form of a matrix filled with the k-space values. If it is then determined by way of the predefined pattern for example that in each case a field of 3×3 k-space values is used during calibration, then this 3×3 field cannot be moved or positioned at will on the matrix of the measurement dataset if no false values or positions of false values, in other words the blank spaces in the reduced measurement dataset, are covered by the 3×3 field, in other words are to be included therein. If, for example, two false values or blank spaces in a column of the matrix are separated from one another only by an uncontaminated k-space value, then this uncontaminated k-space value cannot be used for the calibration of the GRAPPA kernel or kernels, since the 3×3 field cannot be placed between the two blank spaces. Such k-space values in a vicinity of the false values or blank spaces can also be removed, so that only such k-space values which can be used under the abovementioned condition for the calibration of the GRAPPA kernel or kernels remain in the reduced measurement dataset.

Then the calibration of the GRAPPA kernel or kernels is performed using or on the basis of the k-space regions of the reduced measurement dataset which have been identified as usable. The reconstructed k-space values are then calculated for the positions of the blank spaces in the reduced measurement dataset by means of the calibrated GRAPPA kernel or kernels.

The fundamental idea here is therefore to use k-space positions or corresponding k-space values which are not contaminated to calculate the at least one GRAPPA kernel and in turn to use this GRAPPA kernel to fill in the blank spaces of the reduced measurement dataset with the reconstructed k-space values. Because the detected false values are initially removed from the measurement dataset and can therefore be used neither for the calibration of the GRAPPA kernel nor for the calculation and the reconstructed k-space values, the variant of the present disclosure proposed here can advantageously contribute to a particularly effective reduction of artifacts in an MR image generated on the basis of the cleaned measurement dataset.

In an alternative advantageous embodiment of the present disclosure, the calibration of the at least one GRAPPA kernel is initially performed on the entire measurement dataset, in other words on the original measurement dataset. Then all k-space values of the measurement dataset are reconstructed or synthesized, in other words calculated, by means of the at least one calibrated GRAPPA kernel. To identify the false values, the reconstructed k-space values are then compared point-by-point with the k-space values of the original measurement dataset. Here, as the intensity criterion, it is verified in each case whether there is a deviation by at least a predefined amount between a respective reconstructed k-space value and the respective corresponding measured k-space value. The amount predefined for this purpose therefore effectively serves as the threshold value. This amount can be determined or predefined for example on the basis of empirical values for typical peak intensities and/or on the basis of the g-factor of the respective acquisition of the measurement dataset.

Advantageously, individual properties of the measurement dataset or of a respective application can also be considered if necessary, for example if it is known that a magnetic resonance system used to acquire the measurement dataset can lead to or contribute to a relatively high or relatively low level of the measurement values irrespective of any interferences.

In the embodiment described here, the present disclosure, in particular the idea of using the GRAPPA kernel or kernels, can therefore be used for detecting and removing the false values. Because the original measurement dataset prior to a removal or replacement of false values is used to calibrate the at least one GRAPPA kernel, in other words contaminated k-space values can therefore also flow into the calibration. In particular in cases with a relatively small number of artifacts, in other words of contaminated k-space values or k-space positions, and a relatively large number of supporting values, in other words of uncontaminated k-space values, this variant of the present disclosure can be used successfully. This is the case because then the influences of the contaminated k-space values are blurred or diluted or eliminated during calibration, since predominantly uncontaminated k-space values are used in each step of the calibration. Computation effort can therefore be saved here, as it is not necessary to determine which k-space regions can be used for the calibration of the at least one GRAPPA kernel. An improved image quality of an MR image generated on the basis of the cleaned measurement dataset can nevertheless also be improved when this variant is used.

In an advantageous development of the disclosure, it is likewise possible to initially perform a pre-filtering of the original measurement dataset prior to the calibration of the GRAPPA kernel or kernels in order to remove false values or at least certain types or patterns of false values. For this purpose, a separate, larger threshold value can be predefined, for example. This can be selected in such a way that, in a typical scenario or use case, only such k-space values which are attributable with certainty to interferences or external influences, in other words do not specify or characterize any property of the respective examination object being mapped, are detected as false values. After this pre-filtering, the calibration of the GRAPPA kernel or kernels can then be performed as described on the correspondingly pre-filtered measurement dataset. This variant can combine advantages of the different embodiments of the disclosure described.

In an advantageous development of the present disclosure, a k-space value of the measurement dataset in each case is then determined as a false value and replaced with the respective corresponding reconstructed k-space value when or if the respective measured k-space value is greater than the respective corresponding reconstructed k-space value by at least the predefined amount. In other words, therefore, such k-space values which deviate upward by at least the predefined amount from the reconstructed k-space values calculated for the respective position are identified or determined as false values. Such k-space values of the measurement dataset are highly likely to be contaminated, in other words attributable to interferences or external interference influences. In this way, the improved image quality of the resulting MR image can therefore be achieved in a particularly reliable manner, it being possible to keep particularly small a likelihood that uncontaminated k-space values of the measurement dataset are removed or replaced, in other words overwritten.

In an advantageous development of the present disclosure, following the replacement of the false values with the reconstructed k-space values, the method is performed again iteratively starting from the cleaned measurement dataset. Therefore, in a respective next iteration step or iteration run, the cleaned measurement dataset generated in the respective preceding iteration step or iteration run is used in place of the original measurement dataset. Accordingly, the calibration of the at least one GRAPPA kernel is therefore then performed again, namely on the cleaned measurement dataset. All k-space values of the cleaned measurement dataset are then reconstructed by means of the GRAPPA kernel or kernels thus calculated or calibrated, and an attempt is made to identify remaining false values in the cleaned measurement dataset.

This iteration process is continued until no further false values are found in an iteration, in other words in an iteration step or an iteration run, and/or until a predefined number of iterations has been run through, in other words carried out. In this way, it is advantageously possible to achieve a further optimization, in other words improvement of the image quality of the resulting MR image. In particular, the method can be adapted particularly easily and flexibly in this embodiment to given requirements, conditions or limitations in individual cases, particularly with regard to an available time and/or computing power, by only the predefined number of iterations or a predefined permissible number of false values being accordingly adapted, in other words set.

If a measured k-space value which is smaller than the corresponding reconstructed k-space value is identified as a false value during the point-by-point comparison of the reconstructed k-space values with the measured k-space values of the original measurement dataset, this can be used as an indication that there is a false value which is greater than the corresponding reconstructed k-space value in a vicinity of the measured k-space value, in other words in a vicinity of its k-space position. This measured k-space value deviating upward from the respective reconstructed k-space value can propagate its excessively large intensity through the reconstruction process of the k-space values and thus also influence adjacent reconstructed k-space values, which thereby also receive an excessively high intensity value. This can be verified or queried as an additional verification or control step and taken into account accordingly.

On this basis, it is then possible for example to determine a confidence value for the cleaned measurement dataset. It can also be provided for example that the reconstructed value which is greater than the corresponding measured k-space value is not accepted, in other words is not used to replace the smaller, measured k-space value, at least in a respective iteration step. As a result, it is advantageously possible to consider that a cause of the deviation between the reconstructed k-space value and the measured k-space value lies or can lie in another false value. If, for example, the deviation persists across two or more of the above-described iterations, then another cause can be assumed where appropriate and the reconstructed value accordingly rejected or accepted. It can also be possible in such a case to adapt, in particular to reduce, the predefined amount used for the verification of the intensity criterion in order to identify a false value which is the responsible cause of the deviation in a respective k-space vicinity. Overall, this enables the image quality of the resulting MR image to be improved further in a particularly reliable manner.

In a further advantageous embodiment of the present disclosure, a reference dataset is acquired in addition or as part of the original measurement dataset as the basis for the calibration of the at least one GRAPPA kernel. Here, the reference dataset is or will be acquired by means of a reference pulse sequence, which in comparison to a pulse sequence used for the remaining original measurement dataset is less susceptible to at least one type of interferences or interference influences. In other words, the calibration can be performed in whole or in part on the basis of the reference dataset. Because the reference dataset can be acquired in particular with a separate acquisition, the calibration can be performed particularly accurately and reliably, in other words an artifact or contamination influence on the calibration or on the at least one calibrated GRAPPA kernel can be minimized. A reference pulse sequence which is optimized with regard to a robustness against interferences can be used here for the separate acquisition of the reference dataset, advantageously even if this reference pulse sequence is not suitable for acquiring measurement data from which a respectively desired MR image can be reconstructed.

The reference dataset can advantageously be acquired with a reduced resolution compared to the measurement dataset, for example, in order to keep a total acquisition time as short as possible. In this way, it is advantageously possible to achieve or set an optimum compromise in individual cases between the required total acquisition time and the resulting image quality of the MR image.

In a further advantageous embodiment of the present disclosure, correspondingly assigned measurement data from several individual receiving coils which were or are used for a parallel imaging during acquisition of the measurement dataset is acquired as part of the measurement dataset. These individual receiving coils can be arranged on the examination object, for example on a patient, during acquisition of the measurement dataset. For the parallel imaging, it is then determined which measurement values, in other words k-space values, were acquired or measured by means of which of the receiving coils. In this context, the corresponding measurement values are therefore then assigned to the respective individual receiving coil. It is further provided in this embodiment of the present disclosure that the predefined pattern for the calibration of the at least one GRAPPA kernel extends at least over two dimensions of the k-space and over a coil dimension which specifies by means of which of the receiving coils a respective measurement value was measured.

The measurement or k-space values and the coil data or coil assignments can therefore span an abstract three-dimensional space. The pattern for the calibration can accordingly be a three-dimensional pattern in this abstract space. It is thus possible to achieve a particularly accurate and reliable calibration of the at least one GRAPPA kernel. In particular, a larger part of the total available measurement data or measurement values can be used for the calibration of the at least one GRAPPA kernel, since for example not all of the coil data must be rejected or disregarded if an interference has affected or influenced only one of the receiving coils.

If several layers of the respective examination object are sampled, in other words acquired or mapped, in an advantageous development of the present disclosure the pattern for the calibration of the at least one GRAPPA kernel can also extend over a layer dimension, which specifies to which layer a respective measurement value belongs.

The methods described here can be wholly or partially computer-implemented methods.

A further aspect of the present disclosure is a computer program or computer program product comprising commands or instructions which, on execution of the computer program by a computer or a data processing device, cause the latter to carry out at least one embodiment of the method according to the disclosure, in particular automatically or partially automatically. The computer program according to the disclosure codes or in other words therefore represents the method steps of at least one embodiment of the method according to the disclosure, and the computer program according to the disclosure is embodied and configured in particular to be loaded into an in particular electronic and/or electronically readable data store of the computer, in particular of a data processing device of a magnetic resonance system.

A further aspect of the present disclosure is a computer-readable storage medium, on which at least one embodiment of the computer program or computer program product according to the disclosure is stored. The computer-readable storage medium according to the disclosure can in particular be a data carrier for a computer or a data processing device of a magnetic resonance system. Further commands or control instructions for the computer or the magnetic resonance system can be stored on the computer-readable storage medium according to the disclosure.

A further aspect of the present disclosure is a data carrier signal, which transfers or can transfer at least one embodiment of the computer program according to the disclosure.

A further aspect of the present disclosure is a system for cleaning a magnetic resonance dataset. The system according to the disclosure comprises an acquisition device for acquiring the measurement dataset from k-space values. The system according to the disclosure further comprises a calibration device for calibrating at least one GRAPPA kernel on the measurement dataset, with the k-space values of the measurement dataset which are to be used for the calibration being determined by a predefined pattern. The k-space values to be used can therefore be selected by the calibration device according to the predefined pattern.

The system according to the disclosure further comprises a verification device for verifying the k-space values of the measurement dataset against a predefined intensity criterion in order to identify false values. The system according to the disclosure further comprises a reconstruction device for the point-by-point reconstruction of k-space values of the measurement dataset by means of the at least one calibrated GRAPPA kernel by a respective linear combination of respective other k-space values, which are selected in each case according to a predefined schema. The reconstruction device can therefore select the respective other k-space values automatically according to the predefined schema and perform or carry out the corresponding linear combination automatically.

The system according to the disclosure further comprises a replacement device for replacing the identified false values with the corresponding reconstructed k-space values in order to generate a cleaned measurement dataset.

The devices of the system according to the disclosure can be for example program modules of a computer program, in particular of the computer program according to the disclosure, or parts—such as circuits—of a data processing device. In other words, the system according to the disclosure can therefore be configured in particular to carry out at least one embodiment of the method according to the disclosure. To this end, the system according to the disclosure can comprise in particular a computer-readable storage medium according to the disclosure or be configured to read out such a computer-readable storage medium according to the disclosure. The system according to the disclosure can therefore have some or all of the features and/or parts or components specified in connection with the other aspects of the present disclosure.

In order to carry out the method according to the disclosure, the system according to the disclosure can comprise in particular the data processing device or the corresponding computer specified in connection with the other aspects of the present disclosure. This data processing device or this computer can in particular have a microprocessor, microchip or microcontroller, which is connected to a data carrier on which the computer program according to the disclosure is stored. Here, the microprocessor, microchip or microcontroller is embodied and configured to execute this computer program.

The properties and developments of the method according to the disclosure, the system according to the disclosure, the computer program according to the disclosure and the computer-readable storage medium according to the disclosure set out above and in the following, as well as the corresponding advantages, are each analogously and reciprocally transferable between these aspects of the disclosure. Such developments of the aspects of the present disclosure having embodiments which are not explicitly described here in the respective combination or are not described separately for each aspect of the disclosure in order to avoid unnecessary redundancy thus also belong to the disclosure.

BRIEF DESCRIPTION OF THE FIGURES

Further features, details and advantages of the present disclosure are disclosed in the following description of preferred exemplary embodiments and are illustrated in the drawings, in which.

DETAILED DESCRIPTION

The exemplary embodiments set out in the following are preferred exemplary embodiments of the disclosure. The components of the embodiments as described in the exemplary embodiments are each individual features of the disclosure and are also to be considered independently of one another and each also further develop the disclosure independently of one another and are thus also to be considered individually, or in a different combination from that shown, as a constituent of the disclosure. Furthermore, the embodiments described are also enhanceable through other of the previously described features of the disclosure.

Figure 1:
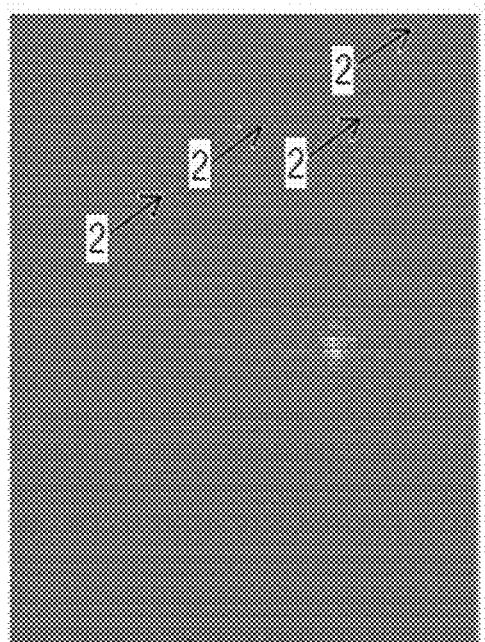
FIG. 1 shows magnetic resonance raw data with several interference peaks at the start of a reconstruction method.

FIG. 1 illustrates a set of MR raw data 1 (MR: magnetic resonance) at the start of a reconstruction chain, in other words at the start of a reconstruction method. The MR raw data 1 contains several interference peaks 2, indicated here by arrows. These interference peaks 2 are pronounced, high-intensity peaks in a peripheral k-space region in which such high k-space values do not usually occur or are not to be expected. The interference peaks 2 are attributable to interference influences during the recording of the MR raw data 1 and therefore do not describe a property of a sampled or mapped investigation object such as a patient 7 (see FIG. 3 and FIG. 6). The MR raw data 1 is therefore contaminated by the interference peaks 2.

Figure 2:
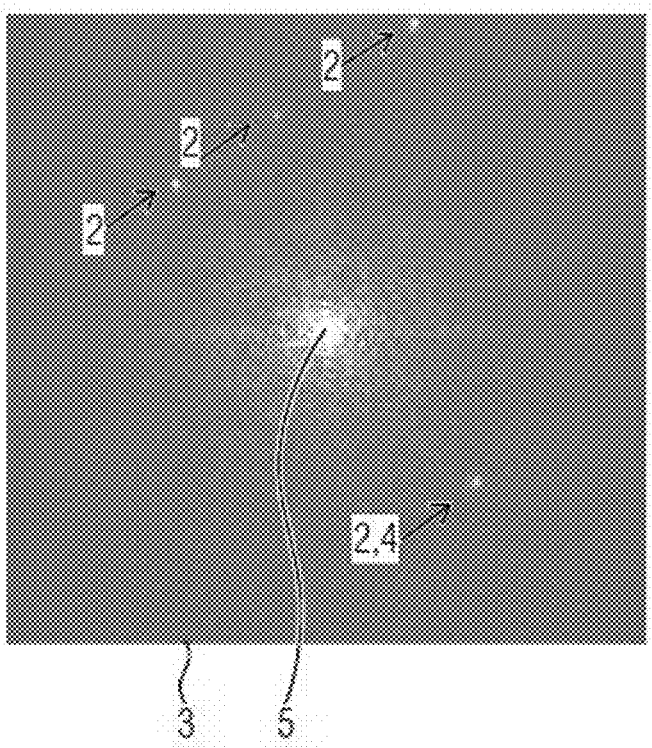
FIG. 2 shows magnetic resonance raw data with several interference peaks at a later step of the reconstruction method.

During conventional reconstruction methods, the MR raw data 1 is processed further. This can comprise for example a filtering, sub-steps for parallel image reconstruction, a partial Fourier reconstruction and/or the like. FIG. 2 shows correspondingly further processed MR raw data 3 at a later step or time in the reconstruction method, for example at the end of a conventional reconstruction chain. As can be seen from the further processed MR raw data 3, the interference peaks 2 already contained in the original MR raw data 1 are partially removed, widened or mirrored into other regions of the k-space during the reconstruction method. A removal of individual interference peaks 2 can occur for example during a readout segmented imaging if segments are partially truncated. If a partial Fourier technique is used, which can typically lead to a doubled artifact energy, at least some of the interference peaks 2 can also be duplicated. In FIG. 2, such a duplicated interference peak 4 can be seen by way of example in the further processed MR raw data 3 at a position in the k-space mirrored at a k-space center 5.

Figure 3:
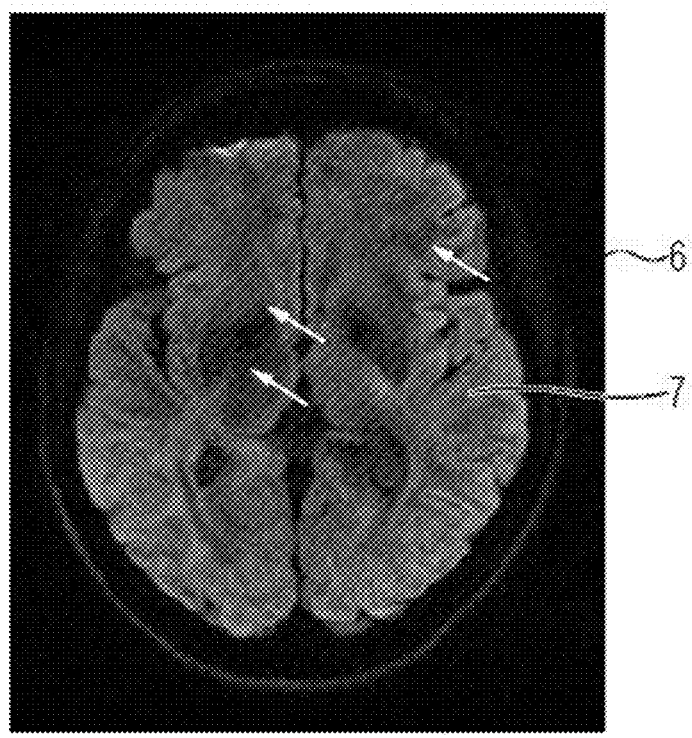
FIG. 3 shows a conventional, degraded MR image generated from the magnetic resonance raw data shown in FIG. 2 with grid artifacts caused by the interference peaks.

FIG. 3 shows a degraded MR image 6 of the patient 7 generated with a conventional reconstruction method from the contaminated further processed MR raw data 3. The interference peaks 2 contained in the further processed MR raw data 3 lead in this case to an intensive grid pattern, in other words to grid artifacts in the degraded MR image 6. Grid artifacts of this kind can for example obscure lesions or make them more difficult to identify, and thus lead or contribute to misdiagnoses.

Figure 4:
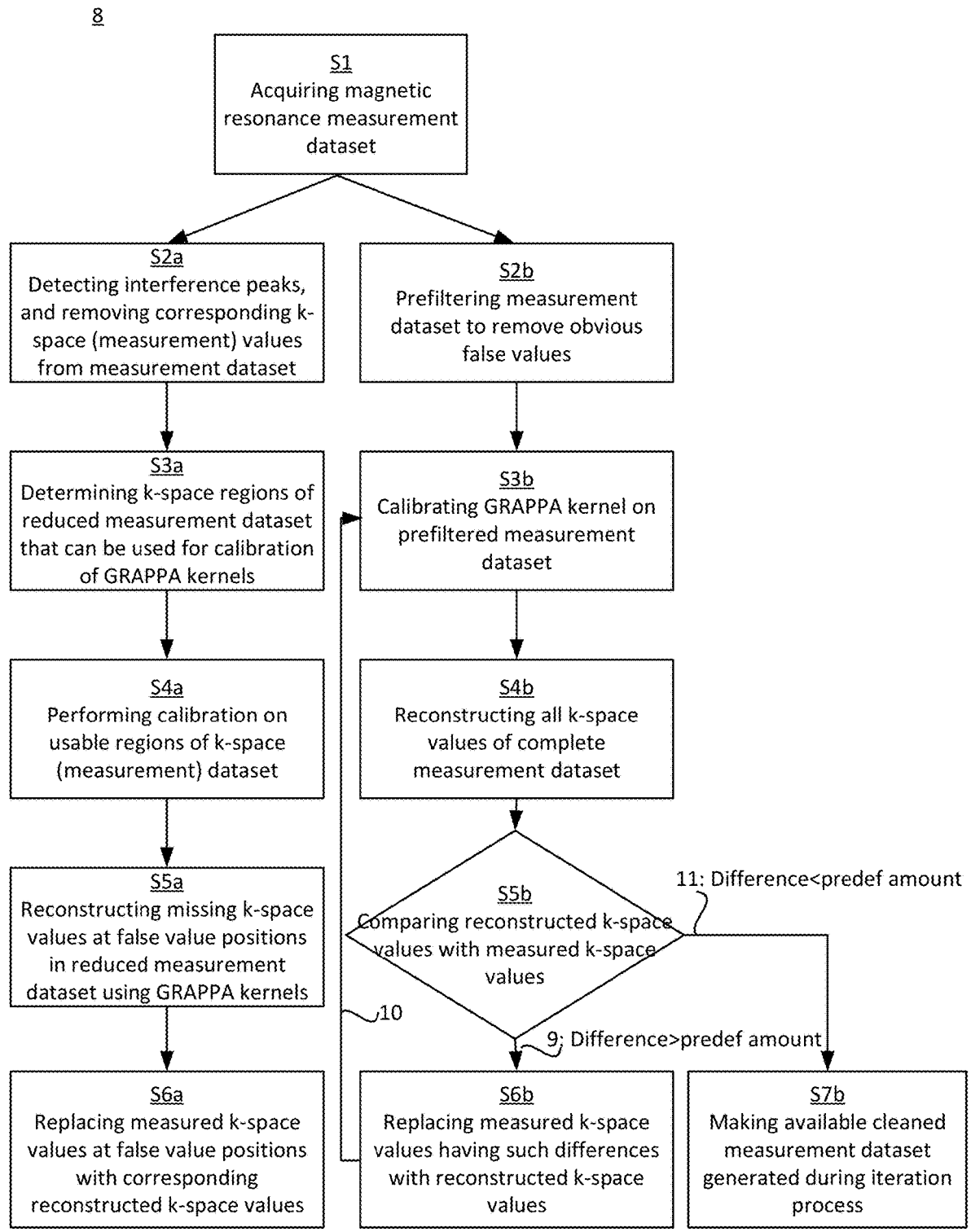
FIG. 4 shows an exemplary schematic flow diagram of a method for cleaning a magnetic resonance measurement dataset.

To avoid these problems and achieve an improved image quality, a method for cleaning a magnetic resonance measurement dataset, in other words for example the MR raw data 1 or the further processed MR raw data 3, can be applied. FIG. 4 shows a schematic representation of an exemplary flow diagram 8 for such a method. In a method step S1, the magnetic resonance measurement dataset, in this case therefore the MR raw data 1, is acquired. A reference scan is optionally also performed and reference data thus acquired is also acquired.

Starting from the acquired measurement dataset, different embodiments of the method are possible. For a first embodiment or embodiment variant of the method, in a method step S2a the interference peaks 2 are detected and the corresponding k-space values, in other words measurement values, are removed from the measurement dataset. In order to detect the interference peaks 2, all k-space values 12 (see FIG. 5) of the measurement dataset can be verified against a predefined intensity criterion. Here, to this end, the k-space values 12 of the measurement dataset are compared with a predefined threshold value. All k-space values 12 which at least correspond to or are greater than the predefined threshold value are interpreted or defined as interference peaks 2, in other words as false values. Here, several differently sized threshold values can also be predefined for different regions of the k-space. It is thus possible to consider that, even without interference influences, k-space values 12 close to the k-space center 5 are usually larger than k-space values 12 in an edge region of the k-space.

Figure 5:
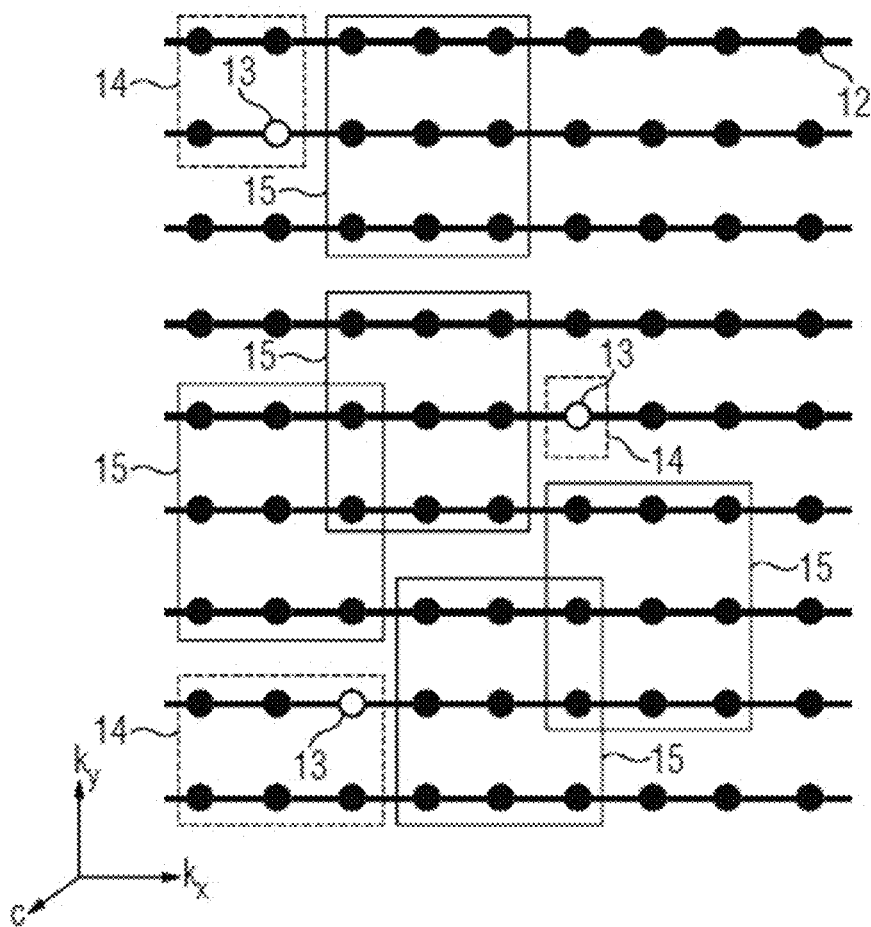
FIG. 5 shows a schematic illustration of a matrix of k-space values to explain the method from FIG. 4.

To this end, FIG. 5 shows a matrix of k-space values 12, in other words of individual data points of the measurement dataset. A coordinate system is specified here as a reference. This coordinate system spans a three-dimensional abstract space comprising two directions or dimensions $k_y$, $k_y$ of the k-space and a coil dimension c. Coil channels assigned to individual receiving coils 19 (see FIG. 6) are plotted along the coil dimension c (not shown here). Here, the k-space values 12 at several false value positions 13 have been removed. In this case, therefore, blank spaces are present at the false value positions 13. In this form, the measurement dataset is also referred to as a reduced measurement dataset.

In a method step S3a, it is determined which k-space regions, in other words which regions of the reduced measurement dataset, can be used for a calibration of at least one, in other words of one or several GRAPPA kernels. Here, the at least one GRAPPA kernel is defined both in the two k-space dimensions $k_y$, $k_y$ and in the coil dimension c, the latter not being shown here. Ideally, the GRAPPA kernel would be calibrated on all k-space values 12 which are not contaminated, in other words which are not false values. In the present example, the GRAPPA kernel is to span 3×3 k-space values 12. Accordingly, a moving calibration window 15 is provided, which also comprises 3×3 k-space values and for the calibration is moved step-by-step over the measurement dataset, in other words the matrix of k-space values 12.

Because however none of the false value positions 13 are to contribute to the calibration, certain exclusion regions 14 of the measurement dataset must be excluded here, which are then disregarded during the calibration. In the present example, the exclusion regions 14 are marked dashed as regions in which the calibration window 15 cannot be positioned without comprising at least one of the false value positions 13. In contrast, purely by way of example, FIG. 5 shows just a few possible positions of the calibration window 15, which are used during the calibration of the GRAPPA kernel. All of the k-space values 12 which lie outside the exclusion regions 14 are therefore used for the calibration. The reference data obtained by means of the reference scan can also be used for the calibration.

The matrix of k-space values 12 shown in FIG. 5 can result from a regular Cartesian sampling pattern. Other samplings or sampling patterns are however also possible. For example, radially extending lines, in other words a point-symmetrical sampling pattern, can be used instead of the transversely extending lines in FIG. 5, on which the k-space values are arranged. Likewise, for example, a sampling density in a region of the k-space center 5 could be greater than in an edge region of the k-space. Different GRAPPA kernels can be calibrated and used in each case for different sampling patterns or k-space patterns to be reconstructed. For example, a separate GRAPPA kernel can be calculated and calibrated for each combination of source values and target values.

In a method step S4a, the calibration is then performed on the usable regions of the k-space or of the measurement dataset, in other words those which lie outside the exclusion regions 14.

In a method step S5a, the missing k-space values at the false value positions 13 in the reduced measurement dataset are reconstructed by means of the calibrated GRAPPA kernel or kernels.

In a method step S6a, the reconstructed k-space values are written to the false value positions 13 or the k-space values originally measured for the false value positions 13 are replaced with the corresponding reconstructed k-space values. A cleaned measurement dataset is thereby generated, which contains neither the interference peaks 2 nor the blank spaces at the false value positions 13. An MR image can then be reconstructed or generated from this cleaned measurement dataset.

For an alternative embodiment or embodiment variant of the method, in an optional process step S2b after the method step S1 a pre-filtering of the measurement dataset is performed in order to remove obvious false values, such as particularly large peaks.

After the method step S1 or where appropriate after the method step S2b, in a method step S3b a calibration of the GRAPPA kernel or kernels on the—possibly still contaminated—measurement dataset is performed. In particular, the calibration can be performed on the entire measurement dataset. In this embodiment of the method, therefore, no exclusion regions 14 are excluded or disregarded for the calibration.

In a method step S4b, all k-space values 12 of the measurement dataset, in other words the complete measurement dataset, are reconstructed. Here, for each one of the k-space values 12 to be reconstructed, k-space values 12 adjacent to the respective k-space value 12 can be used. Different schemas can be used for this purpose. For example, a target k-space value lying in the center of the calibration window 15 can be reconstructed from the eight other source k-space values lying within the calibration window 15.

In a method step S5b, the k-space values thus reconstructed are compared with the original, measured k-space values 12 of the measurement dataset. If deviations or differences which are greater than a predefined amount are found here between one or several pairs in each case comprising a reconstructed k-space value and the corresponding measured k-space value of the measured k-space values 12, then the method follows a path 9 to a method step S6b.

In the method step S6b, the corresponding measured k-space values for which such deviations or differences were found are in each case replaced by the k-space value reconstructed for the respective position.

The method steps S3b to S5b or S3b to S6b are then run through or performed again iteratively for a predefined number of iterations or until no corresponding deviations, in other words no more false values, are found in an iteration of the method step S5b. This iteration process is indicated here by a loop-type path 10.

Starting from the last iteration of the method step S5b, the method then follows a path 11 to a method step S7b.

In the method step S7b, a cleaned measurement dataset generated during the iteration process by replacing the measured k-space values 12 with the reconstructed k-space values is made available for further processing. Here, the cleaned measurement dataset can for example be forwarded to a program module, which generates or reconstructs an MR image from the cleaned measurement dataset. The MR image itself can also be generated in the method step S7b.

The method steps illustrated schematically in FIG. 4 can be or represent program modules of a computer program, which can be executed by means of a computer in order to carry out the method.

Figure 6:
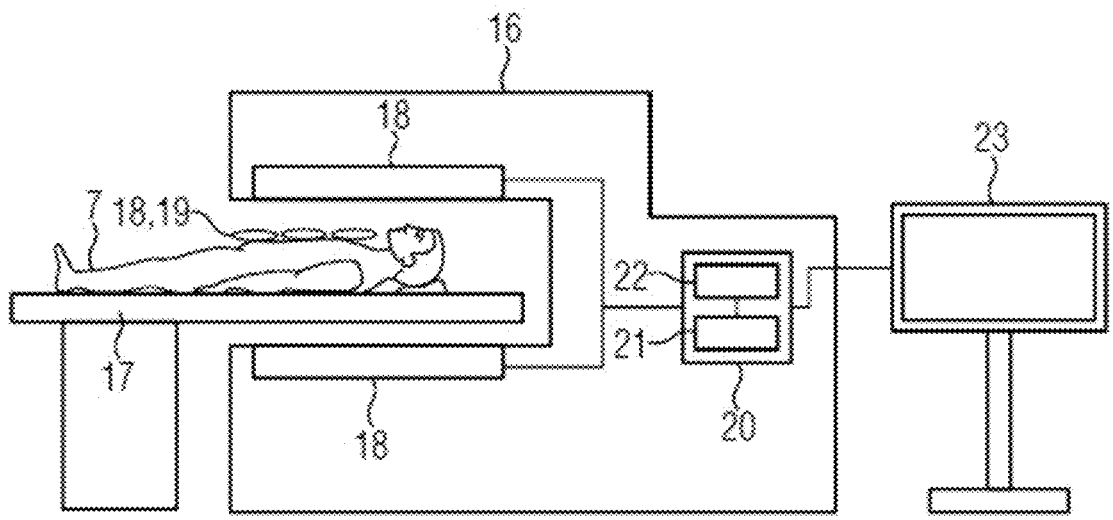
FIG. 6 shows a schematic diagram of a magnetic resonance system for carrying out the method illustrated in FIG. 4.

FIG. 6 shows a schematic representation of a system for carrying out the described method. Here, this system is a magnetic resonance system 16. In this case, the patient 7 to be mapped or examined is located on a patient couch 17. The magnetic resonance system 16 has an acquisition device 18 for sampling or examining the patient 7. Here, the acquisition device 18 comprises a coil arrangement including several receiving coils 19, which are arranged on the patient 7 for recording the measurement dataset.

A data processing device 20 of the magnetic resonance system 16 is connected to the acquisition device 18. The data processing device 20 processes the measurement values or measurement data, in other words the measurement dataset, recorded by means of the acquisition device 18. To this end, the data processing device 20 has a computer-readable data store 21 and a processor device 22 connected thereto. Stored on the data store 21 is a program code, in particular the computer program already mentioned, which contains commands or instructions for the magnetic resonance system 16 or the data processing device 20. This program code or this computer program can be executed by means of the processor device 22 in order to cause the described method to be carried out.

Here, the data processing device 20 or the magnetic resonance system 16 is connected to a display device 23, on which the most recently generated magnetic resonance image of the patient 7 can be displayed.

Overall, the described examples show how an improved image quality of magnetic resonance images can be enabled through data processing.

The invention claimed is:

1. A method for cleaning a magnetic resonance measurement dataset, comprising:
   acquiring the measurement dataset from k-space values;
   calibrating at least one Generalized Autocalibrating Partial Parallel Acquisition (GRAPPA) kernel on the measurement dataset, wherein k-space values of the measurement dataset which are to be used for the calibrating are determined using a predefined pattern;
   verifying the k-space values of the measurement dataset against a predefined intensity criterion in order to identify false values, wherein the predefined intensity criterion is exceeding a predefined threshold value;
   reconstructing k-space values of the measurement dataset point-by-point using the at least one calibrated GRAPPA kernel by a respective linear combination of respective other k-space values, which are selected in each case according to a predefined schema;
   replacing the false values with the corresponding reconstructed k-space values in order to generate a cleaned measurement dataset;
   generating a reduced measurement dataset, initially by removing the corresponding false values from the measurement dataset;
   determining which k-space regions in the reduced measurement dataset can or cannot be used for the calibration of the GRAPPA kernel under the condition that, when the predefined pattern is used, no blank spaces generated by the removal of the false values in the reduced measurement dataset are to flow into the calibration;
   performing the calibration using the k-space regions of the reduced measurement dataset which have been identified as usable; and
   calculating the reconstructed k-space values for the positions of the blank spaces using the calibrated GRAPPA kernel.

2. A system for cleaning a magnetic resonance measurement dataset, comprising:
   an acquisition device configured to acquire the measurement dataset from k-space values;
   a calibration device configured to calibrate at least one GRAPPA kernel on the measurement dataset, wherein k-space values of the measurement dataset which are to be used for the calibration are determined using a predefined pattern;
   a verification device configured to verify the k-space values of the measurement dataset against a predefined intensity criterion in order to identify false values, wherein the predefined intensity criterion is exceeding of a predefined threshold value;
   a reconstruction device configured to point-by-point reconstruct k-space values of the measurement dataset using the at least one calibrated GRAPPA kernel by a respective linear combination of respective other k-space values, which are selected in each case according to a predefined schema;

a replacement device configured to replace the identified false values with the corresponding reconstructed k-space values in order to generate a cleaned measurement dataset;

a generation device configured to generate a reduced measurement dataset, initially by removing the corresponding false values from the measurement dataset;

a determination device configured to determine which k-space regions in the reduced measurement dataset can or cannot be used for the calibration of the GRAPPA kernel under the condition that, when the predefined pattern is used, no blank spaces generated by the removal of the false values in the reduced measurement dataset are to flow into the calibration;

the calibration device further configured to perform the calibration using the k-space regions of the reduced measurement dataset which have been identified as usable; and a calculation device configured to calculate the reconstructed k-space values for the positions of the blank spaces using the calibrated GRAPPA kernel.

3. The method as claimed in claim 1, further comprising:
initially performing the calibration of the GRAPPA kernel on the entire measurement dataset;
reconstructing all k-space values of the measurement dataset using the calibrated GRAPPA kernel; and
in order to identify the false values, comparing the reconstructed k-space values point-by-point with the k-space values of the measurement dataset; and
during the comparing, as the intensity criterion, verifying in each case whether there is a deviation by at least a predefined amount.

4. The method as claimed in claim 3, further comprising:
determining in each case a k-space value of the measurement dataset as a false value; and
replacing each of the false k-space values with the respective reconstructed k-space value if the respective k-space value is greater than the respective reconstructed k-space value by at least the predefined amount.

5. The method as claimed in claim 4, further comprising:
after the replacing of the false k-space values with the reconstructed k-space values, carrying out the method again iteratively starting from the cleaned measurement dataset until no more false values are found in an iteration and/or until a predefined number of iterations has been run through.

6. The method as claimed in claim 1, further comprising:
acquiring additionally or as part of the measurement dataset, a reference dataset as a basis for calibrating the GRAPPA kernel, wherein the reference dataset is recorded using a reference pulse sequence, which in comparison to a pulse sequence used for the remaining measurement dataset is less susceptible to at least one type of interferences.

7. The method as claimed in claim 1, further comprising:
acquiring correspondingly assigned measurement data from several individual receiving coils which were used for a parallel imaging during recording of the measurement dataset as part of the measurement dataset,
wherein the predefined pattern for the calibration of the GRAPPA kernel extends over two dimensions of the k-space and over a coil dimension, which specifies using which of the receiving coils a respective measurement value was measured.

8. A non-transitory computer readable storage medium on which a computer program comprising commands which, on execution of the computer program by a computer, cause the latter to carry out a method as claimed in claim 1.

* * * * *